(12) United States Patent
Alter et al.

(10) Patent No.: US 7,211,893 B2
(45) Date of Patent: *May 1, 2007

(54) INTEGRATING CHIP SCALE PACKAGING METALLIZATION INTO INTEGRATED CIRCUIT DIE STRUCTURES

(75) Inventors: Martin Alter, Los Altos, CA (US); Robert Rumsey, Saratoga, CA (US)

(73) Assignee: Micrel, Incorporated, San Jose, CA (US)

( * ) Notice: Subject to any disclaimer, the term of this patent is extended or adjusted under 35 U.S.C. 154(b) by 135 days.

This patent is subject to a terminal disclaimer.

(21) Appl. No.: 10/980,536

(22) Filed: Nov. 3, 2004

(65) Prior Publication Data

US 2005/0062156 A1     Mar. 24, 2005

Related U.S. Application Data

(63) Continuation of application No. 10/760,434, filed on Jan. 20, 2004, now Pat. No. 6,900,538, which is a continuation-in-part of application No. 10/453,157, filed on Jun. 3, 2003, now Pat. No. 6,917,105.

(51) Int. Cl.
    *H01L 23/48* (2006.01)
(52) U.S. Cl. .................. 257/738; 257/778
(58) Field of Classification Search .......... 257/723, 257/738, 778, 737
    See application file for complete search history.

(56) References Cited

U.S. PATENT DOCUMENTS

| 5,055,907 A | * | 10/1991 | Jacobs | 257/773 |
| 5,192,716 A | * | 3/1993 | Jacobs | 29/832 |
| 5,527,741 A | * | 6/1996 | Cole et al. | 438/107 |
| 6,900,538 B2 | * | 5/2005 | Alter et al. | 257/738 |

OTHER PUBLICATIONS

Dr. Luu Nguyen et al, Assembly Considerations for micro SMD Wafer-Level CSPs. Chip Scale Review, May/Jun. 2000, p. 48 et seq.
James L. Young, Wafer-Level Processing: Working Smarter, Chip Scale Review, May 1997, p. 28 et seq.
Dr. Philip Garrou, Wafer-Level Packaging Has Arrived Semiconductor International, Oct. 2000, p. 119 et seq.

* cited by examiner

*Primary Examiner*—Roy Karl Potter
(74) *Attorney, Agent, or Firm*—Ladas & Parry LLP

(57) ABSTRACT

Wafer-level chip-scale packaging technology is used for improving performance or reducing size of integrated circuits by using metallization of pad-to-bump-out beams as part of the integrated circuit structure. Chip-scale packaging under bump metal is routed to increase the thickness of top metal of the integrated circuit, increasing current carrying capability and reducing resistance. An exemplary embodiment for a power MOSFET array integrated structure is described. Another exemplary embodiment illustrated the use of chip-scale processes for interconnecting discrete integrated circuits.

13 Claims, 4 Drawing Sheets

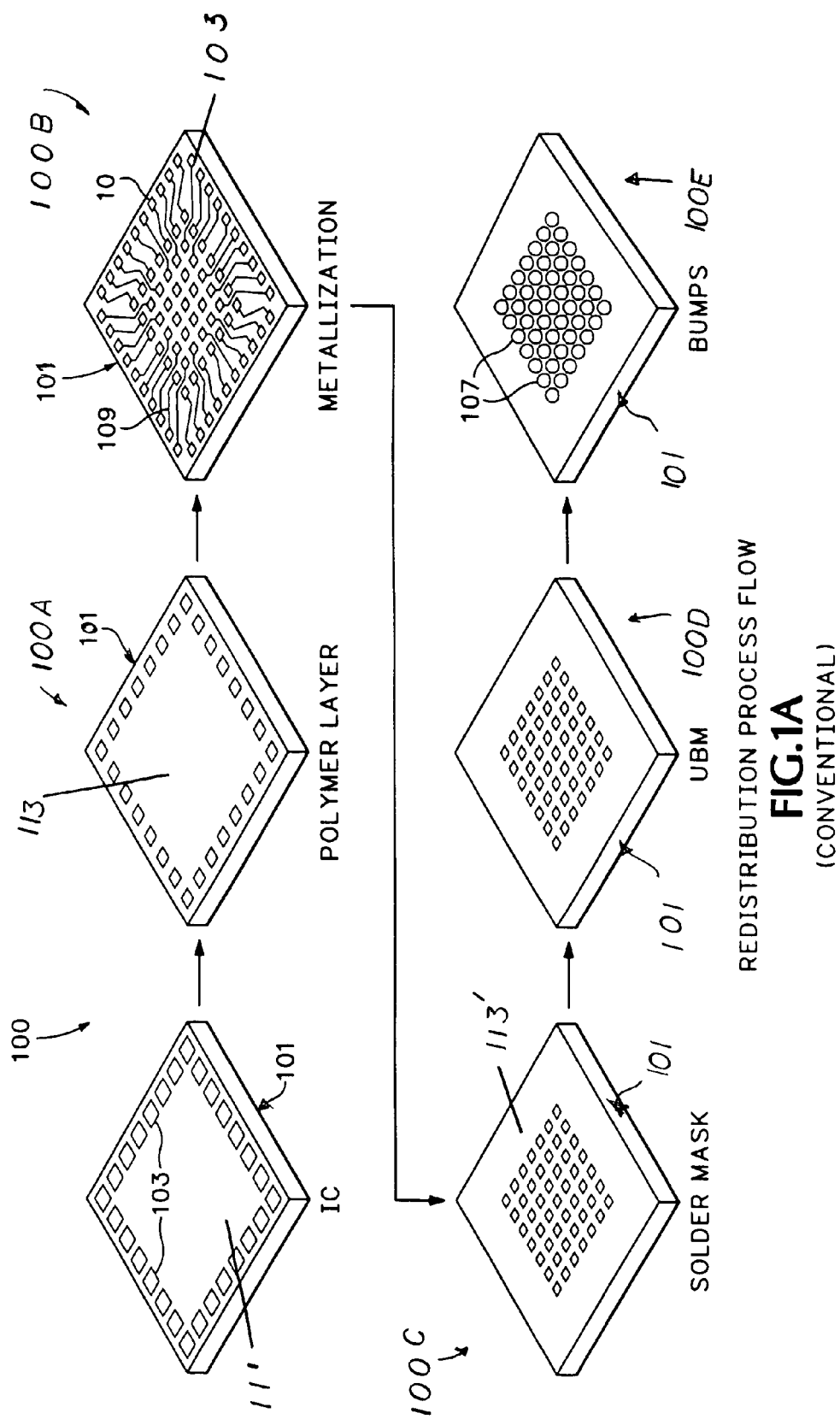
FIG.1A (CONVENTIONAL)

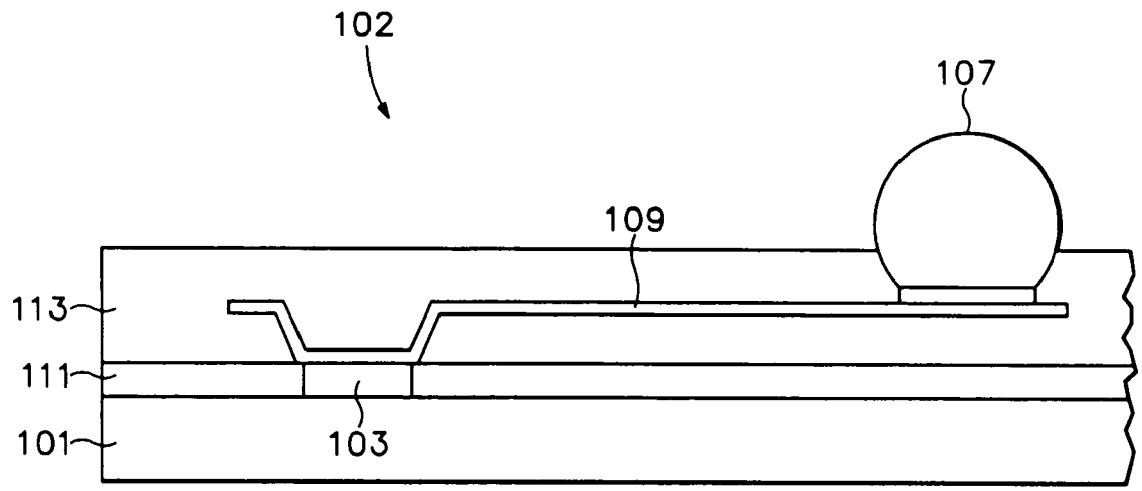
REDISTRIBUTION PARTIAL CROSS SECTION
FIG.1B
(CONVENTIONAL)
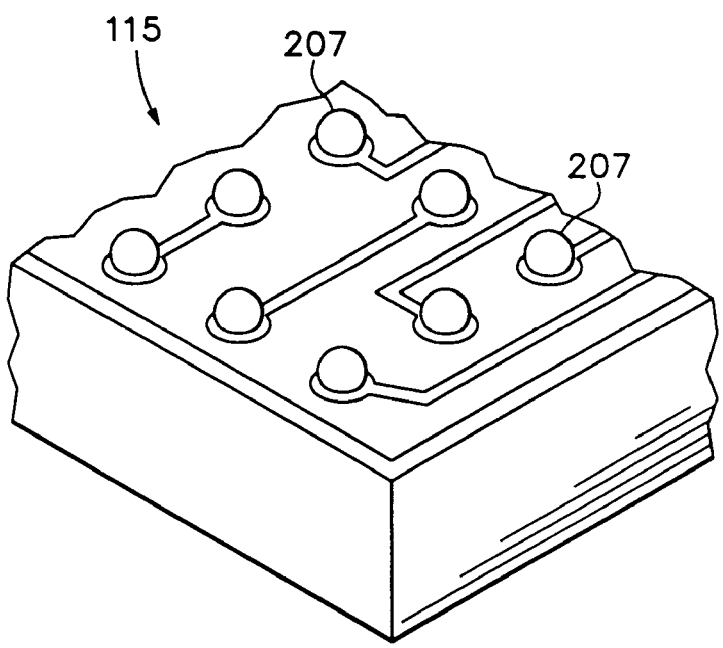
FIG.1C
(CONVENTIONAL)

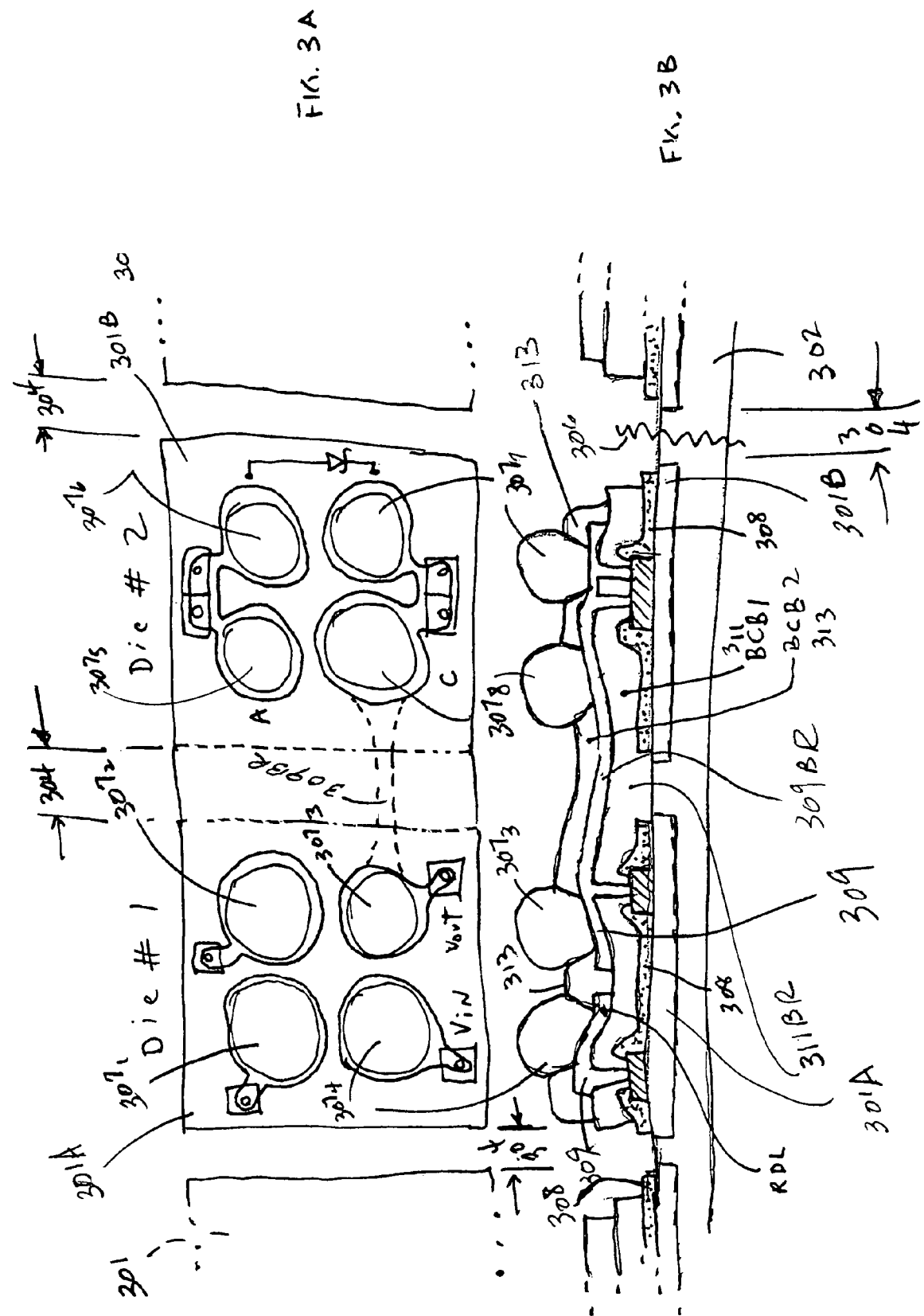

INTEGRATING CHIP SCALE PACKAGING METALLIZATION INTO INTEGRATED CIRCUIT DIE STRUCTURES

CROSS-REFERENCE TO RELATED APPLICATIONS

This application is a Continuation of application Ser. No. 10/760,434, filed Jan. 20, 2004 now U.S. Pat. No. 6,900,538, which is a continuation-in-part of Ser. No. 10/453,157, file Jun. 3, 2003 now U.S. Pat. No. 6,917,105.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

This disclosure relates generally to integrated circuits and, more particularly to integration of chip-scale packaging input-output bump-connection metallurgy into integrated circuit structures.

2. Description of Related Art

Semiconductor integrated circuits ("IC") in the state of the art have been able to pack millions of circuit elements into a relatively small die, or "chip", e.g., having lateral area footprint, e.g., a ¼" by ¼". Most ICs are designed with input-output ("I/O") pads located along the periphery of the chip; some requiring hundreds of such pads.

These pads are then wire-bonded to connect the IC to the macro-world of a printed wire board ("PWB"), also known as printed circuit board ("PCB"), and surrounding discrete elements and other IC electronics on the board. This conventional perimeter-lead surface mount technology ("SMT") for complex circuitry with appropriate interconnects often requires a chip carrier several times greater in size than the chip itself.

For mobile appliances—e.g., cellular telecommunications products, portable digital assistants ("PDA"), notebook computers, and the like—or applications where physical space for computers and instrumentations is extremely valuable—e.g., aircraft, space shuttles, and the like—individual component size and weight are factors which are critical to successful design. Thus, there is a conflict between a higher density of IC elements on the chip with attendant higher input/output ("I/O") needs and a simultaneous demands for continuing miniaturization with increased functionality.

Wafer-level packaging ("WLP"), wherein a single IC die and its mounting package are manufactured and tested on a multi-die wafer produced by the IC manufacturer prior to singulation into individual chips, offers many advantages to the chip manufacturer. One WLP solution known in the art is generally referred to in the art as chip-scale packages ("CSP"). Chip-scale packaging technology, where the peripheral pads are connected to I/O solder balls by a redistribution metal layer, provides die-sized packaging, allowing more condensed PCB patterns, also referred to in the art as "land patterns" where elements have a specific area "footprint."

Exemplary, conventional, chip-scale technology is demonstrated by FIGS. 1A and 1B, taken from Semiconductor International magazine, October 2000, pp. 119–128, "Wafer-Level Packaging Has Arrived," by Dr. Philip Garrou, illustrating the process 100, FIG. 1A, and resultant structure 102, FIG. 1B, for chip-scale packaging I/O redistribution. As shown in FIG. 1A, "IC" 101 peripheral I/O pads 103 have an electrical redistribution to I/O bumps 107 via known manner processes. Step 100A illustrates the formation of a lower "POLYMER LAYER" 113, FIG. 1B, (e.g., benzocyclobutene, "BCB") of the chip-scale WLP structure. Step 100B "METALLIZATION" illustrates an I/O electrical redistribution for the chip 101 by formation of traces 109 from pads 103 leading to a centralized region of the chip. Steps 100C and 100D, "SOLDER MASK," "UBM," respectively, illustrate the upper polymer layer 113', FIG. 1B, formation. The process continues, step 100E, "BUMPS," with an I/O bump formation step wherein the bumps 107 (e.g., solder balls) are located inwardly from the chip 101 periphery.

Conductive material (such as a metal, e.g., copper) beams 109 (FIG. 1B) are lithographically defined superjacent the chip passivation layer 111, e.g., a plasma nitride or the like, generally referred to in the art as the "topside layer," and within a protective-covering-stress-absorbing material (e.g., resin, polyimide, or the like) 113, 113', providing a conventional IC 101. A cross-section of a chip-scale I/O bump-out packaging structure is shown in FIG. 1B. A variety of implementations are described by Garrou. In current wafer-level packaging, these additional layers of the chip-scale package are generally so formed on the wafer after the die fabrication is completed, yielding a plurality of packaged die on the wafer, which has many advantages for the manufacturer. A thereafter singulated die with chip-scale package 115 with eight bumps 107 is illustrated in FIG. 1C, showing that the total footprint is essentially the same as the die area. The present invention relates to further discoveries in this regard.

While chip-scale packaging has many advantages, it may also be recognized by those skilled in the art that in the current state-of-the-art, some die may be too small to accommodate a requisite number of bumps for the input-output requirements of an underlying chip. Moreover, in wafer-scale fabrication or for applications which may take advantage of providing a chip-set device including more than one individual die with appropriate interconnections, it would be advantageous to take further advantage of the process steps as shown in FIG. 1A in constructing appropriate layouts.

Many publications describe the details of common techniques used in the fabrication of integrated circuits that can be generally employed in the fabrication of complex, three-dimensional, IC structures; see e.g., *Silicon Processes,* Vol. 1–3, copyright 1995, Lattice Press, Lattice Semiconductor Corporation (assignee herein), Hillsboro, Oreg. Moreover, the individual steps of such a process can be performed using commercially available IC fabrication machines. The use of such machines and common fabrication step techniques will be referred to hereinafter as simply: "in a known manner." As specifically helpful to an understanding of the present invention, approximate technical data are disclosed herein based upon current technology; future developments in this art may call for appropriate adjustments as would be apparent to one skilled in the art.

BRIEF SUMMARY

The basic aspects of the invention generally provide for use of chip-scale packaging metallization as part of an integrated circuit active element metallization layer. In an exemplary embodiment, the present invention provides for power MOSFET (metal-oxide-semiconductor-field-effect-transistor) size reduction by including the use of chip-scale metallization as part of the die structure itself.

In aspect of the invention, an exemplary embodiment is shown as an integrated circuit structure including chip-scale packaging, the structure including: a plurality of active elements in a surface of a semiconductor die; at least one conductive-material bus electrically interconnecting said active elements; said chip-scale packaging including at least one, conductive-material, input-output bump extending outwardly from said die for electrically connecting said plurality of active elements to off-die electronics, and a beam of conductive material connecting said bus to said bump; and said bus having a construction wherein the conductive material forming said beam is extended to regions of said structure for thickening of said bus such that resistance of said bus is reduced.

In another aspect of the invention, an exemplary embodiment is shown as a power MOSFET array integrated circuit device including: at least a first row of drain regions in a semiconductor surface; at least a second row of source regions in said surface; channel regions in said surface, separating source regions of said second row from respective drain regions of said first row; a gate structure superjacent respective said channel regions; a first conductive trace for electrically coupling said drain regions to a first input-output pad; a second conductive trace for electrically coupling said source regions to a second input-output pad; a first conductive beam for electrically coupling said first input-output pad to a first input-output chip-scale packaging bump; and a second conductive beam for electrically coupling said first input-output pad to a second input-output chip-scale packaging bump, wherein conductive material forming said first conductive beam is routed onto and thickens said first conductive trace for reducing resistance thereof, and conductive material forming said second conductive beam is routed onto and thickens said second conductive trace for reducing resistance thereof.

It is another aspect of the present invention to provide a method for improving $(R_{ON})$*Area figure-of-merit for an integrated circuit, including a top metal layer, where $R_{ON}$ is a predetermined resistance characteristic and Area is the lateral footprint area of the integrated circuit, the method including: forming active elements, including said top metal layer, in and on a first surface a semiconductor substrate; and forming metal beams for chip-scale packaging input-out bumps such that metallization of said beams also extends onto said top metal layer, increasing the thickness thereof.

Another aspect of the present invention provides an integrated circuit die having an array of MOSFET devices, each having at and interconnect traces, having individual elements of said devices sharing a common top metal trace and pad respectively, the die further including bump out contacts with metal beams for connecting to said MOSFET elements respectively, the die further comprising: said top metal trace in contact over a top surface thereof with a respective said one of said metal beams formed in either a long, narrow, single strip via juxtaposed with the IC top metal, a first via connecting the metal down to the top metal as the bump-out metal comes into the IC device active element regions which extends across the active element regions to a second via at a distal end or, wherein the MOSFET is an array broken up into two or more sections having a plurality more tack down vias therefor.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

BRIEF DESCRIPTION OF THE DRAWINGS

FIG. 1A (Conventional) is a schematic chip-scale process flow diagram.

FIG. 1B (Conventional) is a partial cross section, elevation view, of a chip-scale I/O redistribution die formed in accordance with the process as shown in FIG. 1A.

FIG. 1C (Conventional) is a schematic perspective view of a singulated wafer-level chip-scale package and attached die resultant from a process and fabrication as shown in FIGS. 1A and 1B.

FIG. 3A is a plan view (overhead) schematic illustration of a region of a semiconductor wafer, showing two complete and two cutaway integrated circuit dice wherein a chip-scale interconnect is incorporated between die.

FIG. 3B is an elevation view projection of the schematic illustration of FIG. 3A.

Like reference designations represent like features throughout the drawings. The drawings in this specification should be understood as not being drawn to scale unless specifically annotated as such.

DETAILED DESCRIPTION

To simplify the description of the present invention, a simplified embodiment of an IC structure comprising an array of power MOSFETs is used. No limitation on the scope of the invention is intended by the inventors in using this simple device example, nor should any be implied therefrom. Those skilled in the art will recognize that the basic methodology of this described technology can be extended to most types of die, having other active elements besides MOSFET elements—e.g., emitter and collector pairs of bipolar transistors, anode/cathode pairs, diode poles, programmable logic arrays elements, and the like—which are amenable to chip-scale packaging and where a PIE characteristic is definable.

As set forth in the Background section hereinabove, miniaturization of ICs is a continuing goal; chip-scale packaging is a technology in furtherance of this goal. One measure-of-performance, or figure-of-merit, for power MOSFET ICs, having a given operating voltage, is to have a lowest possible "$(R_{ON})$*Area" product in milliohms-mils$^2$. That figure-of-merit is also referred to hereinafter as PowerFET Interconnect Efficiency ("PIE"). However, it is recognized that for power MOSFET chip designs there is a true PIE characteristic reflecting the difference between an ideal test pattern, defining 100% efficiency, and losses induced inherently by silicon implementation and packaging result in a PIE in the approximate range of 50%–75%. Much of the loss in efficiency may be attributable to the metal electrical traces running to I/O pads and particularly to the wire-bonds used in SMT packaging. The use of CSP packaging therefore eliminates the wire-bonds provides one improvement in the PIE characteristic by decreasing the $R_{ON}$ factor for a given chip footprint. Simply increasing each buses thickness during die fabrication to reduce $R_{ON}$ itself for a given chip footprint is complex, e.g., requiring added steps such as electro-less plating. The present invention improves the state of the art by using CSP technology to lower the PIE characteristic for a chip, and further, where desirable for miniaturization, to reduce the footprint for a given PIE value.

Figure 2A:
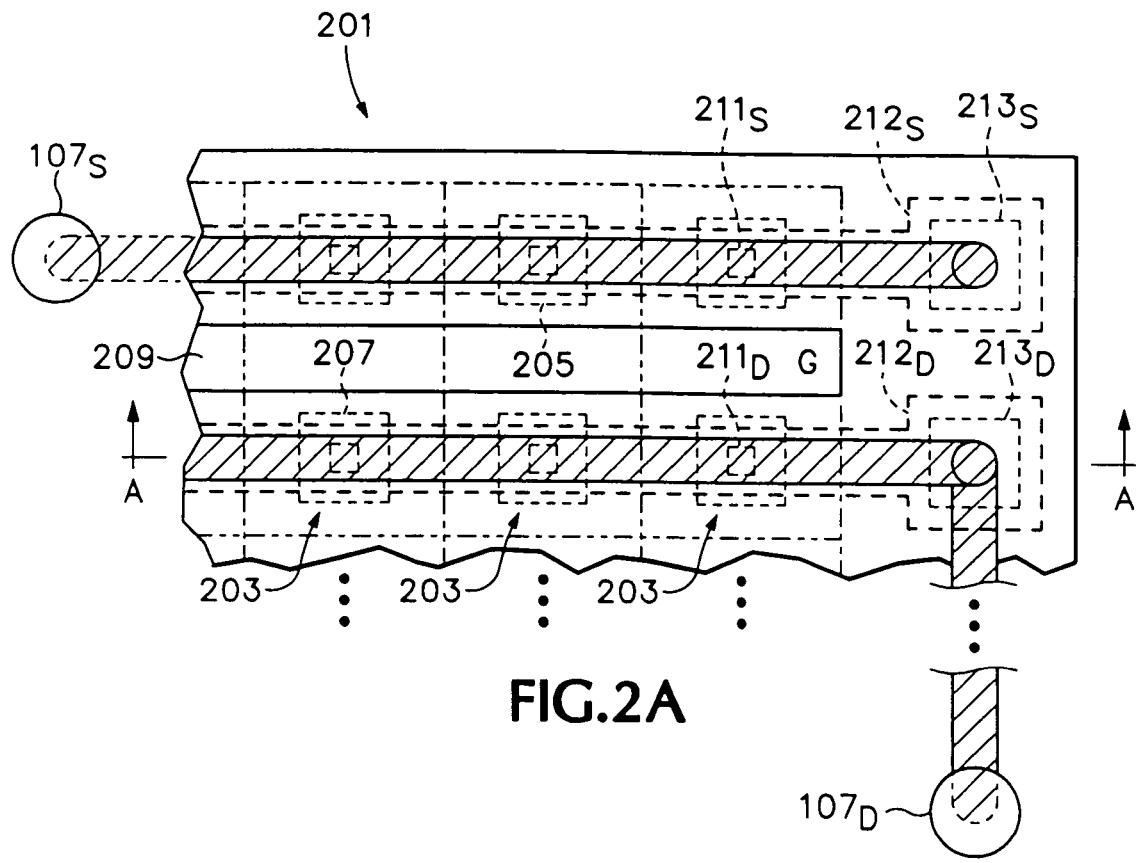
FIG. 2A in accordance with a first exemplary embodiment of the present invention is a schematic IC layout view for a simplified power MOSFET array.

FIG. 2A, a partial device layout view, schematically illustrates a simplified MOSFET array IC device 201 comprising standard power MOSFETs 203, having respective source 205, "S," and drain 207, "D," regions. A gate structure 209 overlays the channel region between each source 205 and drain 207 of each MOSFET 203. Contacts $211_S$, $211_D$ to each respective source 205 and drain 207 are provided for connecting metal traces $212_S$, $212_D$ to I/O pads $213_S$, $213_D$ for the respective source/drain regions. It will be recognized that in many implementations, the sources 205 are a continuous strip and the drains 207 are a continuous strip. Note here, that in alternative IC embodiments, these source/drain metal traces may be, in fact, any top metal layer—commonly referred to in the art as "Metal 1," "Metal 2," "Metal 3," et seq., depending on the specific IC functionality and I/O requirements of particular elements of the chip's active devices.

Figure 2B:
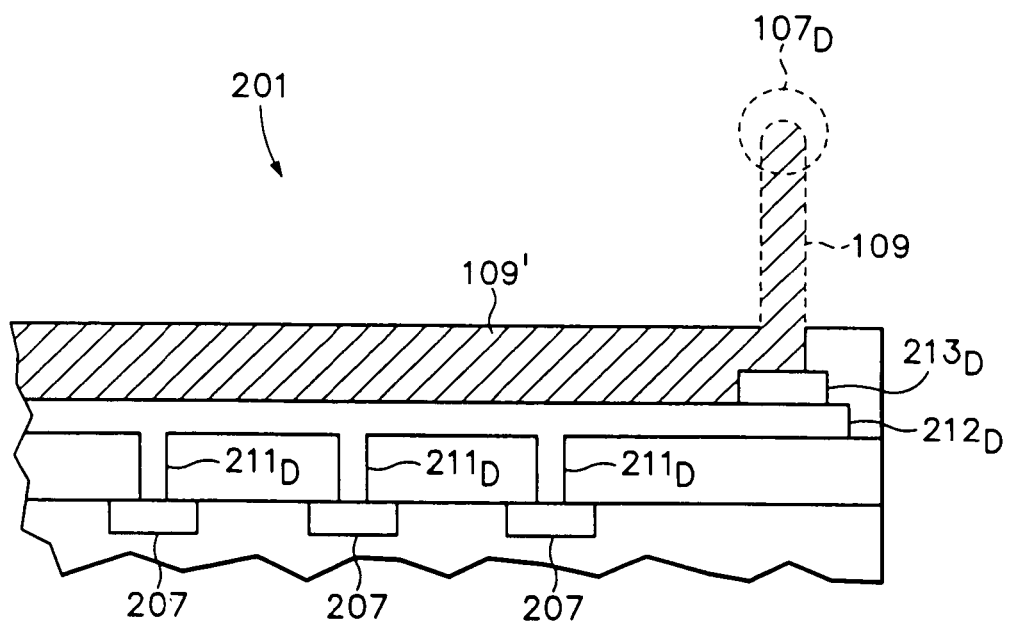
FIG. 2B is an elevation view for a partial cross section of the structure as shown in FIG. 2A.

Turning also to FIG. 2B, a schematic elevation view of device 201 through plane A—A of FIG. 2A is provided. The illustration is of a cross-section through separate drain regions, but again, in other implementations, those regions may be a continuous strip. In terms of the prior art, it is known that a passivation material normally overlays the metal traces $212_{S,D}$. Looking also back to FIG. 1B, it should be recognized that the pad 103 there is equivalent to a pad $213_{S,D}$ in accordance with the present invention as shown in FIGS. 2A and 2B. Conventionally, next, a chip-scale metal beam 109 used for the pad-to-bump redistribution to I/O bump 107 of FIG. 1B would be formed so as to be embedded in the protective-covering-stress-absorbing material 113. Another via would be required above the pad 103 to bring the metal beam 109 down to the pad 103.

Now however, referring back to FIGS. 2A and 2B, in order to improve PIE in accordance with the present invention, in redistribution of an I/O pad $213_{S,D}$ to a bump 107 (pseudo-isometrically shown in FIG. 2B), metal traces $212_{S,D}$ are opened, respectively, to $Via_2$ by appropriate masking and etching, or other in a known manner, in a geometry wherein the formation of the beam 109 also deposits metal 109' on the associated trace. Remember $Via_2$ was conventionally used only for the pad-to-bump interconnect as shown in FIG. 1B, but now $Via_2$ for each respective region is also open, forming a slot or trench, across the top surface of the already formed metal trace $212_{S,D}$ comprising respective source and drain interconnects. Therefore, deposition, or reflow, of the heretofore CSP metal—as in step 105, "Metallization," of the Redistribution Process Flow of FIG. 1A—to form what in FIG. 1B is only an encapsulated beam 109 from the I/O pad 103 out to the bump 107, now also lays the same metal 109', FIG. 2B, superjacently to the source/drain metal $212_{S,D}$. In this manner, the first metallization of the I/O redistribution process is combined with the conventional Pad Mask step of die fabrication.

In other words, the masking and metallization steps are modified so that rather than merely being formation of the redistribution beam 109 from a pad 213 to an associated bump 107, the metal 109, 109' also forms superjacent an exposed surface of the top metal 212 of the device as shown in FIG. 2B. This effectively increases the thickness of the metal traces $212_{S,D}$. Increasing the thickness of the metal traces reduces the resistance, therefore enhancing the electrical current capability, and therefore lowers PIE for the same die area for a given IC operating voltage. Depending on the specific implementation and IC design in accordance with the present invention, it has been determined that the $(R_{ON})$*Area product may be improved by a factor in the range of approximately 10–30%.

There are at least three fundamental fabrication process techniques for having the bump-out metal 109, 109' also be in direct contact with the IC top metal 212 to achieve this structure. First, a long, narrow, single strip via juxtaposed with the IC top metal may be provided. Second, a first Via connecting the metal down to the top metal as the bump-out metal comes into the IC device active element regions, which then stretches across the active element regions to a second via at a distal end. Third, similar to the second, except wherein the device transistor array is broken up into two or more sections to allow more tack down vias. The first is preferred where the element array is wide enough to support a single, long, narrow via. Thus, it should be recognized by those skilled in the art that a variety of implementations may be constructed in accordance with the need of any specific IC design.

Moreover, looking a complementary aspect of the present invention, if the current $R_{ON}$ is an acceptable operational design specification, conventional die shrink technology may be employed to reduce the die footprint. In other words, for a predetermined specification for $R_{ON}$, lateral footprint area of said structure may be reduced by a factor in the range of approximately 10–30%.

The possibility of modifications and variations for other types of integrated circuits, discrete devices, logic devices, thin-film resistor arrays, and the like, will be apparent to practitioners skilled in the art. Clearly, a variety of specific geometric arrangements for the beams and overlay of beam metal onto the top metal can be tailored for each implementation.

Turning now to FIGS. 3A and 3B, an exemplary embodiment of a method and structure for using chip-scale process to interconnect a plurality of chips together is demonstrated. Such a method and structure provides an advantage of allowing semi-customization of chip sets. For example, if a wafer is fabricated having very small individual die—for example, a relatively simple, smart switch IC device—where the single die is too small for four chip-scale I/O bumps, using existing tooling and incorporating chip-scale metallization as described herein, it would be possible to interconnect sets of the chips, e.g., four in parallel, putting one bump on each die. Various such implementations can be envisioned. Another embodiment is described with respect to FIGS. 3A and 3B.

As seen from an overhead view in FIG. 3A, at the wafer fabrication level, a plurality of die 301, "Die #1" 301A and "Die #2" 301B being shown in substantially complete form, are formed in and on a wafer 302. In the normal course of chip manufacture, the region 304 between each chip 301 is where scribe lines, illustrated by line 306, are formed for separating the die into individual dice for further packaging. Normally, a chip passivation layer 308, e.g., a nitride, is absent in the scribe line regions 304.

However, it is known in the art to manufacture chip-sets composed of a plurality of chips which are conventionally separated from the wafer, repackaged, mounted on circuit boards and interconnected appropriately. As an exemplary implementation, assume Die #1 301A is a booster switch IC device and Die #2 301B is a Schottky diode IC device to prevent an over-voltage feedback into the switch; the two chips 301 A, 301B are therefore to be interconnected as a chip-set.

As described hereinabove with respect to FIGS. 1B, 1C, 2A and 2B, fabricating a chip-scale type packaged chip 102, 115, 201, respectively, with I/O bumps 107, 207, $107_x$, respectively, in accordance with the present invention, one can make use of the bump beams 109, 109' as top-most metal layer for the integrated circuit itself. For manufacture of discrete chips, it is conventional to mask off the wafer to eliminate the formation in the scribe line regions 304 of passivation 308 between dice. In chip-scale fabrication, a person skilled in the art would also in like manner eliminate the formation of chip-scale passivation material 111 and chip-scale polyimide material 113, FIG. 1B in the scribe line regions 304. However, in accordance with the present invention and this exemplary embodiment of FIGS. 3A and 3B, for chip-scale fabrication, the polyimide-like (preferably benzocyclobutene, "BCB") layers "BCB1" 311 and "BCB2" 313 between die 301A, 301B which are to be electrically interconnected are not eliminated between die to be interconnected, in this example at respective chip component bumps $307_3$, $307_8$.

In the fabrication process in accordance with the present invention, when the first chip-scale polyimide-like layer 311 is formed, the mask is appropriately left open according to a predetermined design between the die 301A, 301B to be interconnected in order for a polyimide-like bridge 311BR, FIG. 3B, to be formed where the electrical interconnect is needed between die. In other words, after the active components (not shown) of each IC 301 are formed with individual chip passivation layer 308 and pad contacts superjacent a top surface 305 of the wafer and chips therein, the subsequent mask step for forming the polyimide-like 309 for the chip-scale bump-out structure is used for form appropriate polyimide-like bridges 309BR between chips in accordance with the specific implementation design. It is an advantage of the present invention that polyimide-like material will flow well over the known layer elements, alignment markers, and the like, in the scribe line region 304.

As can be recalled with respect to FIG. 1A, the redistribution "metallization" creates the interconnect beams 109, FIG. 1B, between each chip I/O pad 103 and its associated bump 107. Returning to FIGS. 3A and 3B, with the polyimide-like bridge 311BR left between predetermined bumps $307_3$, $307_8$ on different die 301A, 301B, respectively, when the top metal layer and bump beams 309 are formed to connect associated chip pads 303 and bumps 307, the ReDistributed Layer (RDL) metal will also flow across the scribe line region 304 between associated dice 301A, 301B, forming an electrical interconnect 309BR.

Thus, in accordance with the present invention, the I/O bumps 107, 207, 307 which act as electrical interconnection terminals for discrete chips and the process used in forming the bumps are now employed for interconnecting chips during wafer fabrication. It can also be recognized that the same concept is applicable to system-scale chip sets and wafer-scale integrated circuit devices. Concomitant formation of the bump beams 309 and inter-die electrical bridges 309BR provides simplicity in creating a wafer-level fabrication mask-set.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements during the term of the patent, and that adaptations in the future may take into consideration those advancements, in other word adaptations in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

The invention claimed is:

1. An integrated circuit structure comprising:
    a first die, having chip-scale packaging including at least one first input-output bump, first associated redistribution beam and first associated die pad;
    a second die, having chip-scale packaging including at least one second input-output bump, second associated redistribution beam and second associated die pad; and
    an electrical interconnect between the first die and the second die wherein the electrical interconnect uses at least one same metallization layer for forming each of said redistribution beams.

2. The structure as set forth in claim 1 wherein said at least one same metallization layer further comprises a top metal layer of at least one of said die.

3. The structure as set forth in claim 1 further comprising:
    a plurality of more than two dice and a plurality of electrical interconnects between said plurality of more than two dice using the at least one same metallization layer.

4. The structure as set forth in claim 3 in a wafer-scale integrated circuit device.

5. The structure as set forth in claim 1 wherein said structure is formed on a wafer having a scribe line region between said first die and said second die, a polyimide-like bridge across said region and superjacent an active component surface of said first die and said second die and subjacent said at least one same metallization layer.

6. An integrated circuit chip set comprising:
    a plurality of discrete integrated circuit devices, each of said devices including discrete circuit elements and associated input-output pads, wherein each of said devices includes chip-scale packaging bump input-output terminals connected by conductive material layer beams to the electrical pads; and
    electrical traces connecting said discrete integrated circuit devices wherein said electrical traces are concomitant with the conductive material layer forming the beams.

7. The integrated circuit chip set as set forth in claim 6 in a wafer-scale integrated circuit device.

8. The integrated circuit chip set as set forth in claim 6 further comprising:

a dielectric material layer subjacent said electrical traces.

9. The integrated circuit chip set as set forth in claim 6 wherein said plurality of discrete integrated circuit devices are connected in parallel via said electrical traces.

10. The integrated circuit chip set as set forth in claim 6 wherein said plurality of discrete integrated circuit devices are connected in via said electrical traces such that said traces are formed concurrently with a top metal layer of said discrete integrated circuit devices.

11. An integrated circuit die chip set comprising:

each die having bipolar components, MOSFET components, or both, said components sharing a common top metal layer and input-output pads respectively, each die further including chip-scale packaging bump out contacts with metal beams for connecting bumps thereof to said pads, respectively, wherein said metal beams are formed integrally with said common top metal layer and said top metal layer further forms a die-to-die electrical connection bridge.

12. The chip set as set forth in claim 11 further comprising:

a dielectric layer subjacent said bridge.

13. The chip set as set forth in claim 12 wherein said dielectric layer comprises:

a layer of benzocyclobutene.

* * * * *